(12) United States Patent
Nistler et al.

(10) Patent No.: US 6,410,191 B1
(45) Date of Patent: Jun. 25, 2002

(54) PHASE-SHIFT PHOTOMASK FOR PATTERNING HIGH DENSITY FEATURES

(75) Inventors: John L. Nistler, Martindale; Stuart E. Brown, Austin, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/344,458

(22) Filed: Jun. 25, 1999

(51) Int. Cl.[7] ................................................. G03F 9/00
(52) U.S. Cl. ......................................................... 430/5
(58) Field of Search ........................... 430/5, 322, 323, 430/324; 378/34, 35

(56) References Cited

U.S. PATENT DOCUMENTS

| | | | |
|---|---|---|---|
| 5,281,500 A | * 1/1994 | Cathey et al. | 430/5 |
| 5,308,722 A | 5/1994 | Nistler | 430/5 |
| 5,370,975 A | * 12/1994 | Nakatani | 430/325 |
| 5,487,962 A | 1/1996 | Rolfson | 430/5 |
| 5,672,450 A | 9/1997 | Rolfson | 430/5 |
| 5,695,896 A | * 12/1997 | Pierrat | 430/5 |
| 5,882,534 A | 3/1999 | Song | 216/12 |
| 5,942,355 A | 8/1999 | Brainerd et al. | 430/5 |
| 5,976,733 A | * 11/1999 | Hashimoto | 430/5 |

FOREIGN PATENT DOCUMENTS

EP 0686876 12/1995

OTHER PUBLICATIONS

International Search Report dated Jun. 5, 2000 (PCT/US00/00697; TT3033–PCT).

* cited by examiner

Primary Examiner—Mark F. Huff
Assistant Examiner—Saleha R. Mohamedulla
(74) Attorney, Agent, or Firm—Williams, Morgan & Amerson, P.C.

(57) ABSTRACT

A method for forming a photomask includes providing a transparent substrate and forming an opaque layer over at least a first portion of the transparent substrate. The opaque layer is patterned to define a mask pattern and expose at least a second portion of the transparent substrate. The second portion is etched to define a phase shifting region. The width of the phase shifting region defines a critical dimension. The critical dimension is measured, and the phase shifting region is etched based on the critical dimension to undercut the optically opaque layer. A photomask includes a transparent substrate and a phase shifting region defined in the transparent substrate. The phase shifting region includes sloped sidewalls having a slope of less than about 85°.

17 Claims, 8 Drawing Sheets

PHASE-SHIFT PHOTOMASK FOR PATTERNING HIGH DENSITY FEATURES

BACKGROUND OF THE INVENTION

1. Field of the Invention

The present invention relates generally to lithographic techniques employed in the manufacture of integrated circuits (ICs), and, more particularly, to the fabrication of a reticle mask used in photolithography to process semiconductor wafers.

2. Description of the Related Art

A reticle mask, also referred to as a photomask, may be used to transfer a pattern to a semiconductor wafer. The pattern to be transferred onto the wafer is typically formed on a substantially transparent photomask substrate, such as quartz. Generally, standard photolithography processes are used to pattern a non-transparent material, such as a metal film over the photomask substrate. Chromium is a common material used to form the pattern.

FIG. 1A illustrates a commonly used binary mask 10 used to pattern a wafer. The binary mask 10 includes a substrate 12, such as quartz, on which chromium traces 14 have been formed to define a photomask pattern. Due to limitations imposed by the wavelength of light used to transfer the pattern, resolution at the edges of the patterns of the photomask degrades, thus limiting the application of the binary mask 10 as the geometry of the features to be formed on the wafer decreases.

FIG. 1B illustrates a prior art phase-shift mask 20, developed to increase the resolution of patterns that can be formed on a wafer. A phase-shifting region is formed by forming a trench 22 in the photo-mask substrate 12. A standard phase-shift mask 20 is generally formed by depositing chromium traces 24 of appropriate width and separation and etching the vertical trench 22 in the photo-mask substrate 12 in the region defined between adjacent traces 24. The essentially vertical walls (e.g., 85° to 90°) of the trench 22 define phase edges 26 that provide a transition between high and low refractive index regions. The depth of the trench 22 determines the amount of phase shift produced by the phase-shift mask 20 relative to the wavelength of the incident radiation. Typically, the depth of the trench 22 is selected to provide a 180° phase shift, and the width of the trench 22 is less than the wavelength of the incident radiation.

Exemplary techniques for forming the trench 22 are described in U.S. Pat. No. 5,308,722, entitled "VOTING TECHNIQUE FOR THE MANUFACTURE OF DEFECT-FREE PRINTING PHASE SHIFT LITHOGRAPHY," and U.S. Pat. No. 5,851,704, ENTITLED "METHOD AND APPARATUS FOR THE FABRICATION OF SEMICONDUCTOR PHOTOMASK," both of which are incorporated herein by reference in their entireties.

The characteristics of the phase-shift mask 20 generally relate to a hard or strong phase-shift type mask, commonly known as an "alternating aperture" or "Levenson-type" phase-shift mask. These types of masks include transmission regions (light transmitted through the substantially transparent regions) on either side of a patterned opaque feature (e.g., the chromium traces 24). One of these transmission regions is phase-shifted from the other (i.e., trench 22, and both sides transmit approximately 100% of the incident radiation. Light diffracted underneath the opaque regions from these phase-shifted regions cancels, thereby creating a more intense null, or "dark area." The feature (e.g., polysilicon line or photoresist line) to be patterned on the wafer is defined by the null region.

FIG. 1C illustrates a chromeless phase-shift mask 30. Chromium traces 32 (shown in phantom) are used to define the trench 22 and are subsequently removed. The null region used to pattern the feature on the wafer forms below the phase edge 26. The chromeless phase-shift mask 30 is capable of patterning smaller features than the phase-shift mask 20 of FIG. 1B. In the chromeless phase-shift mask 30, the distance between adjacent features on the wafer, commonly referred to as the pitch, is defined by the width of the trench 22. The width of the trench 22 is determined by the spacing between the chromium traces 32, which are used in the reactive ion etch of the photo-mask substrate 12 to define the trench geometry.

Using present photolithography approaches, it is difficult to form the chromium traces 32 sufficiently close to pattern dense features on the wafer. A typical approach to forming the traces 32 involves forming the traces 32 larger than the desired size and using one or more isotropic etches to remove a portion of the material to arrive at traces 32 of the desired critical dimension. As is known to those of ordinary skill in the art, the subsequent etching of the traces 32 actually adds to the variability in the critical dimension, limiting the usefulness of this approach.

As is known to those of ordinary skill in the art, the ability of a photomask to imprint a pattern on a wafer is determined in part by the resolution and the depth of focus. Simplified equations for resolution and depth of focus are described below:

$$R = \frac{k_1 \lambda}{NA^2} \quad \text{(Resolution)} \tag{1}$$

$$D = \frac{k_{21} \lambda}{2 \cdot NA} \quad \text{(Depth of Focus)} \tag{2}$$

The resolution and depth of focus depends mostly on the numerical aperture (NA) of the lens unit and the wavelength of the incident radiation. The correction factors $k_1$ and $k_2$ depend on the process, material, resist, etc. Other factors, such as chromatic and spherical aberrations in the lens used to project the light on the photomask, also have an effect on the resolution and depth of focus, but their relative contributions are small.

Another factor that theoretically affects the resolution and depth of focus is the partial coherence of the incident radiation. Partial coherence is a relative measure of the degree to which the incident radiation is columnated. For example, light from a laser is typically fully columnated (i.e., very little scattering; perpendicular angle of incidence), and is referred to as fully coherent (i.e., PC=1). On the other hand, light with a high amount of scattering (i.e., any angle of incidence), such as light that might come from a flashlight, is referred to as incoherent (PC=0). Light between these extremes is referred to as partially coherent. Typically binary photomasks are used with light having a partial coherence of about 0.65–0.7, and phase-shift masks are used with light having a partial coherence of 0.45–0.6. Due to the nearly vertical walls that define the phase edges of a phase-shift mask, changing the partial coherence of the light has essentially no effect on the resolution or depth of focus.

Previous methods used to increase resolution, and thus, decrease pitch, have involved decreasing the wavelength and/or increasing the numerical aperture. Both of these approaches increase resolution at the expense of depth of focus, and as of yet, have not been successful in implementing high-density feature layouts.

For the reasons described above, chromeless photomasks have seen little application in a production environment for extremely high feature densities. The present invention is directed to overcoming, or at least reducing the effects of, one or more of the problems set forth above.

SUMMARY OF THE INVENTION

One aspect of the present invention is seen in a method for forming a photomask. the method includes providing a transparent substrate and forming an opaque layer over at least a first portion of the transparent substrate. The opaque layer is patterned to define a mask pattern and expose at least a second portion of the transparent substrate. The second portion is etched to define a phase shifting region. The width of the phase shifting region defines a critical dimension. The critical dimension is measured, and the phase shifting region is etched based on the critical dimension to undercut the optically opaque layer.

Another aspect of the present invention is seen in a photomask including a transparent substrate and a phase shifting region defined in the transparent substrate. The phase shifting region includes sloped sidewalls having a slope of less than about 85°.

BRIEF DESCRIPTION OF THE DRAWINGS

The invention may be understood by reference to the following description taken in conjunction with the accompanying drawings, in which like reference numerals identify like elements. and in which.

Figure 1A:
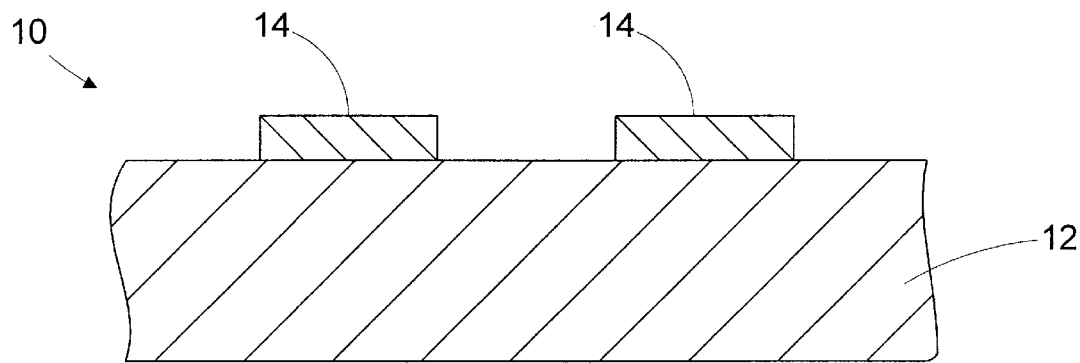
FIGS. 1A through 1C are cross-sectional diagrams of a prior art photomasks.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
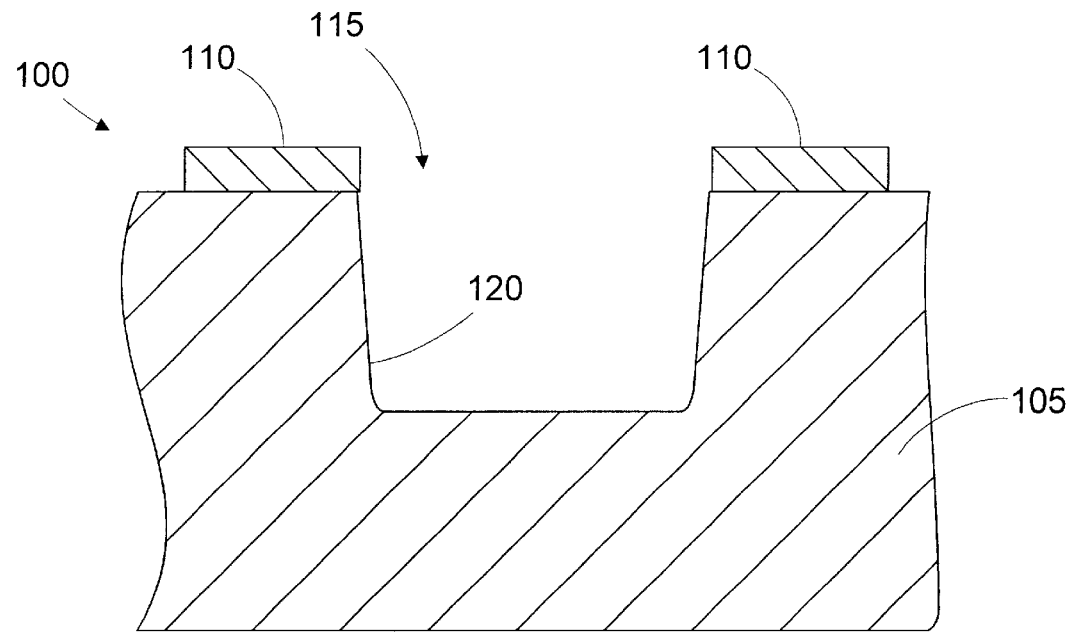
FIG. 2 is a cross-sectional diagram of a phase-shift photomask in accordance with the present invention.

Referring now to FIG. 2, a cross-sectional view of a phase-shift photomask 100 in accordance with the present invention is provided. The photomask 100 is shown in a partially completed state. The photomask 100 includes a quartz substrate 105 with a chromium patterning layer 110 formed thereon. The chromium patterning layer 110 is used to define a trench 115 in the quartz substrate 105 using techniques know in the art, such as a reactive ion etch. The formation of the chromium patterning layer 110, its thickness on the quartz substrate 105, and the patterning of the chromium patterning layer 110 are conventional. and therefore are not discussed in detail herein for clarity. Likewise, the quartz etching procedure and the etchant employed are conventional and are not discussed herein. The walls of the trench 115 are substantially vertical (i.e., about 85° to 90°).

It is contemplated that any of a variety of opaque materials may be employed in place of chromium in the chromium patterning layer 110. Examples include molybdenum, polysilicon, and gold (for visible light lithography), silicon carbide (for X-ray lithography), and silicon nitride, titanium oxide, and selenium oxide (for deep UV lithography). Also, any variety of transparent materials may be employed in place of the quartz substrate 105, such as silica-based glass.

The critical dimension of the chromium patterning layer 110 (i.e., the distance between traces) defines the placement of the trench 115, and thus, also defines the placement of the sidewalls 120 of the trench 115. The sidewalls 120 define "phase edges" that determine the placement of features, such as photoresist or polysilicon lines, when the photomask 100 is used to pattern a wafer. The distance between the phase edges (i.e., the sidewalls 120) defines a critical dimension of the photomask 100, because it determines the pitch of the features to be subsequently patterned. An exemplary use for the photomask 100 is to pattern high-density transistors.

Figure 3:
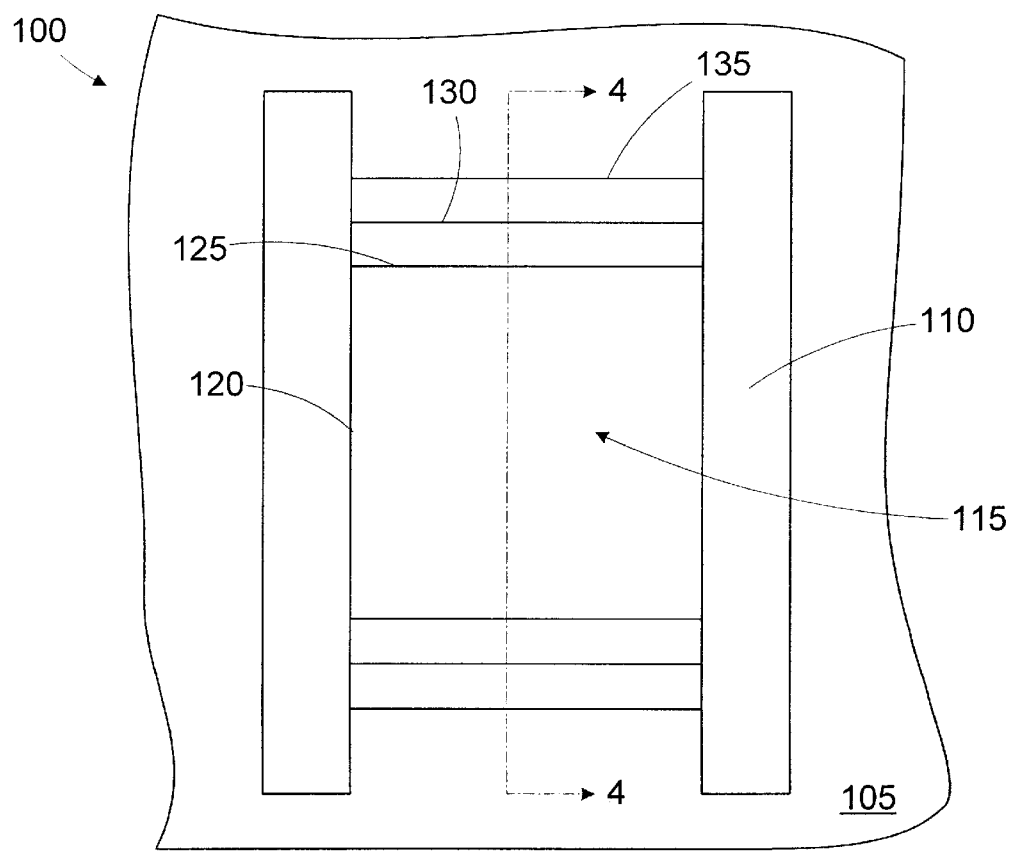
FIG. 3 is a top view of the phase-shift photomask of FIG. 2.
Figure 4:
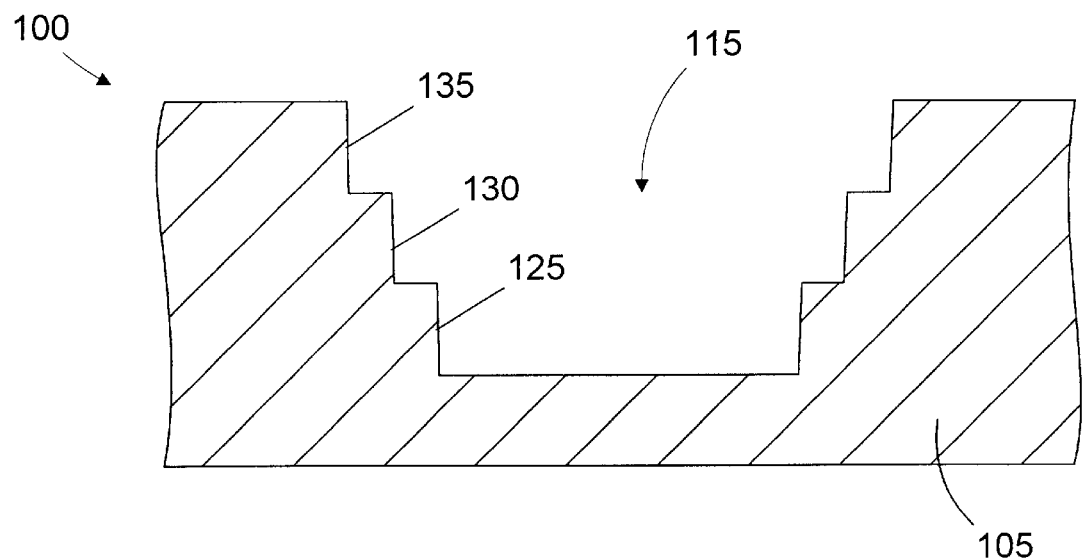
FIG. 4 is a cross-sectional view of the phase-shift photomask taken along line 4—4 in FIG. 3.

FIG. 3 illustrates a top view of the photomask 100 of FIG. 2, and FIG. 4 illustrates a cross-sectional view of the photomask 100 taken along line 4—4 in FIG. 3. The depth of the trench 115 is determined, based on the wavelength of the incident light to be used with the photomask 100, such that a 180° phase shift occurs at the vertical edges 120. In the horizontal direction, a series of graduated phase edges 125, 130, 135 is created to prevent a horizontal line from being formed when the photomask 100 is used to pattern a wafer (i.e., lines are formed only for 180° transitions). The edge 125 defines a transition between the 180° phase shift and a 120° phase shift, the edge 130 defines a transition between the 120° phase shift and a 60° phase shift, and the edge 135 defines a transition between the 60° phase shift and a 0° phase shift. The use of the graduated edges 125, 130, 135 is known to those of ordinary skill in the art, and their formation may be completed using a variety of techniques, such as the voting technique of the '722 patent or the multi-layer approach of the '704 patent.

Figure 1B:
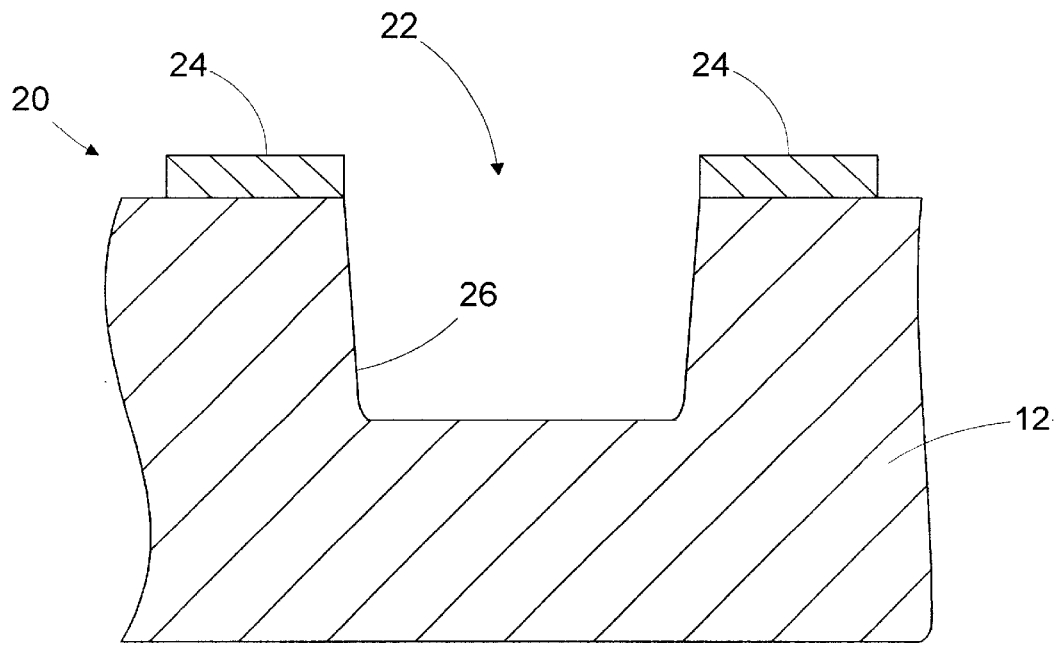
Figure 1C:
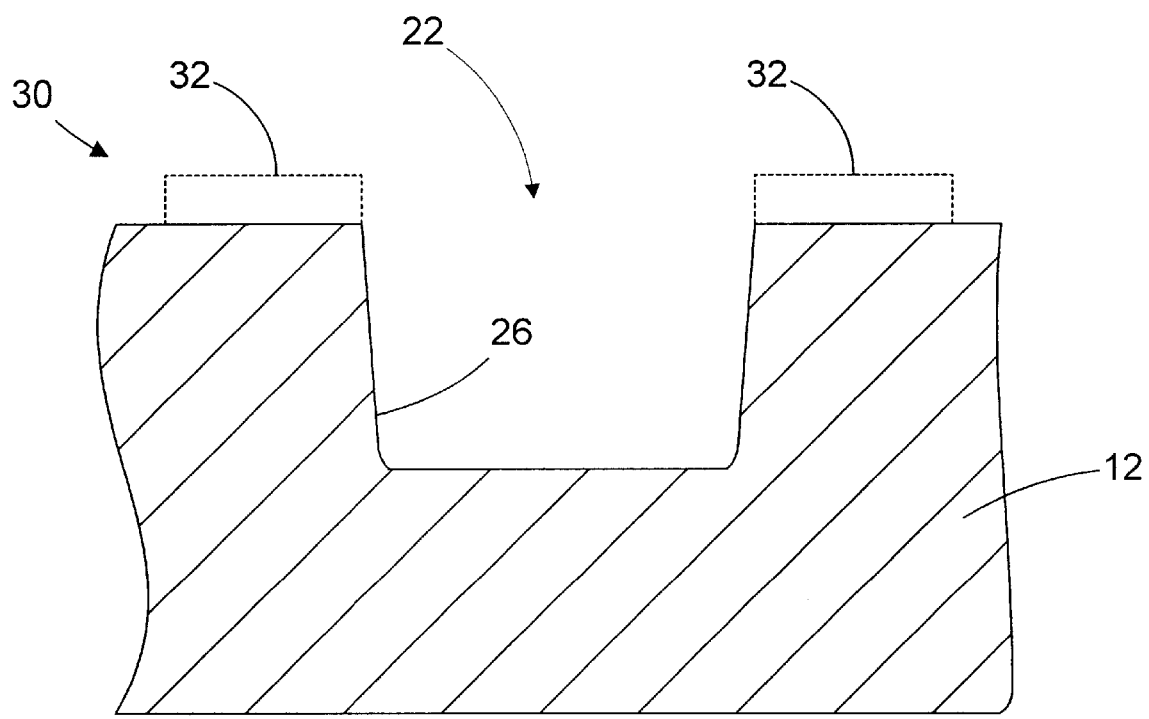

After formation of the chromium patterning layer 110, the critical dimension and the initial depth of the trench are measured. Typically, the chromium patterning layer 110 is formed such that the width of the resulting trench 115 is less than the actual desired width. Previous techniques, as shown in FIGS. 1B and 1C have attempted to control the critical dimension by subsequent etching of the chromium patterning layer 110, which actually tends to increase the variability in the critical dimension.

Figure 5:
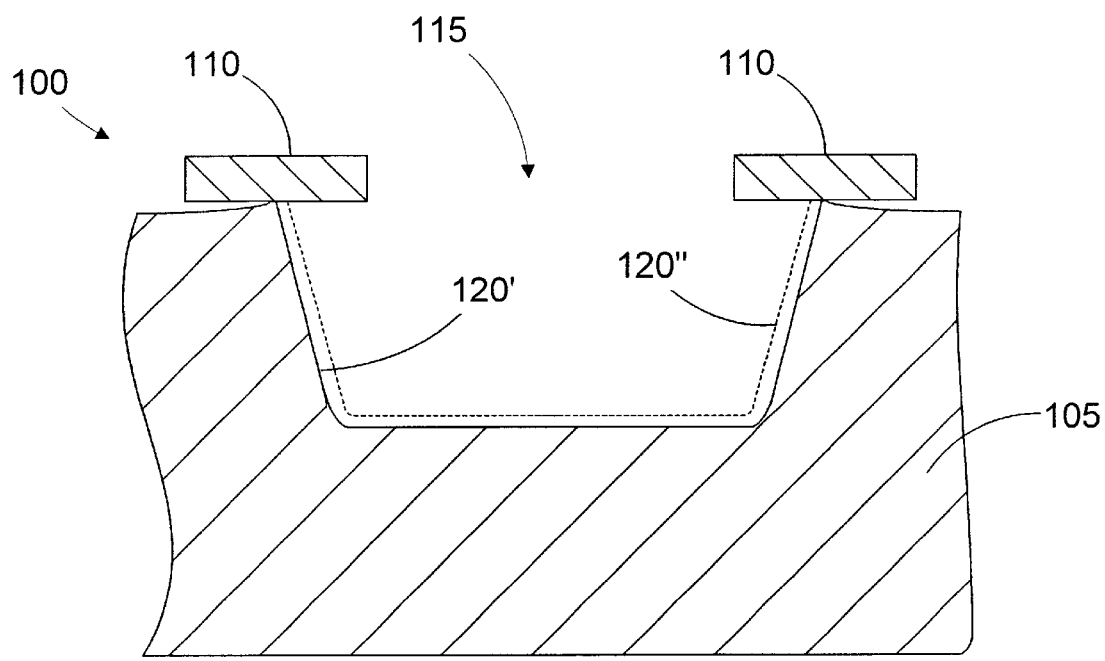
FIG. 5 is a cross-sectional view of the phase-shift photomask of FIG. 2 subsequent to an undercut etch.
Figure 6:
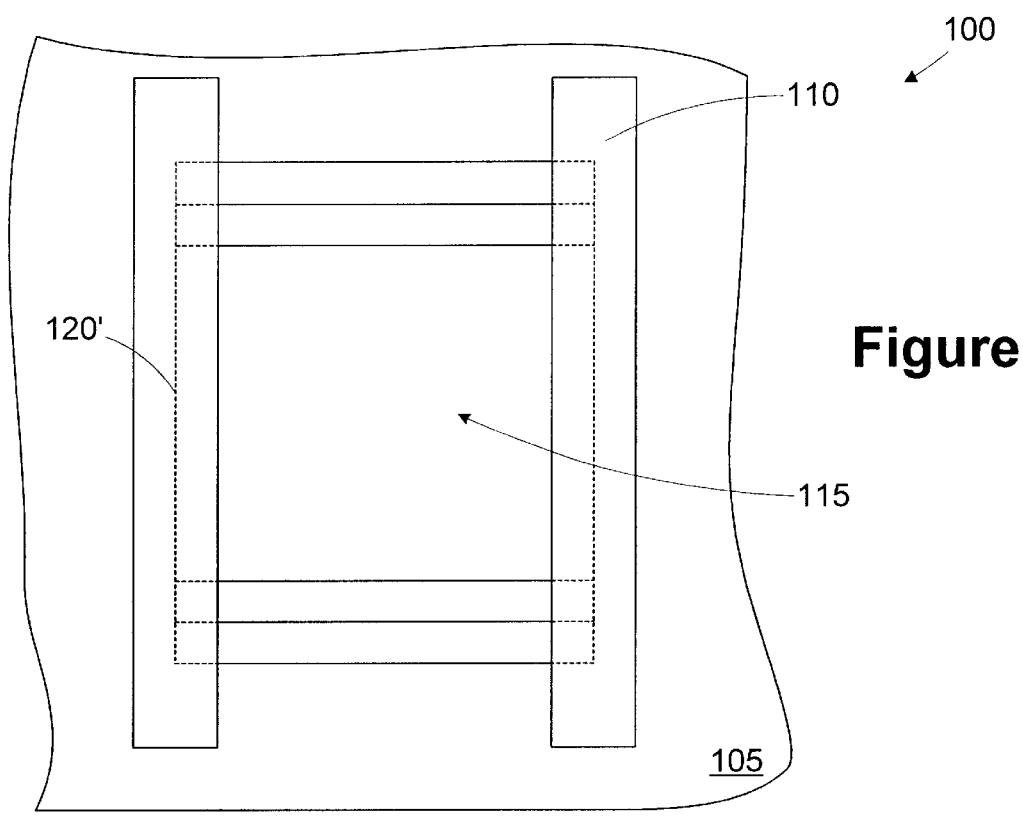
FIG. 6 is a top view of the phase-shift photomask of FIG. 5.

Based on the average critical dimension over the entire photomask 100, as might be measured using a Tencor profilometer or a VEECO atomic force microscope, for example, a subsequent undercut etch is performed to widen the trench 115, thus defining, sidewalls 120' as shown in FIG. 5. The undercut etch comprises a wet etch having a relatively slow etch rate. For example a solution of NaOH has been found to be suitable for performing a 100 Å undercut etch. The undercut etch may be stopped at any point to allow the critical dimension to be re-measured. Because the undercut etch is isotropic, the trench depth may be subsequently re-measured to determine the amount of undercut achieved, and thus, the resultant critical dimension. The undercut etch may then be repeated until the desired critical dimension is reached, as indicated by a dashed line 120" in FIG. 5 to illustrate the intermediate profile. Unlike previous chrome etching techniques, repeated undercut etches do not cause an increase in the variability of the critical dimension. A top view of the photomask 100, after the undercut etch has been complete, is illustrated in FIG. 6.

Figure 7:
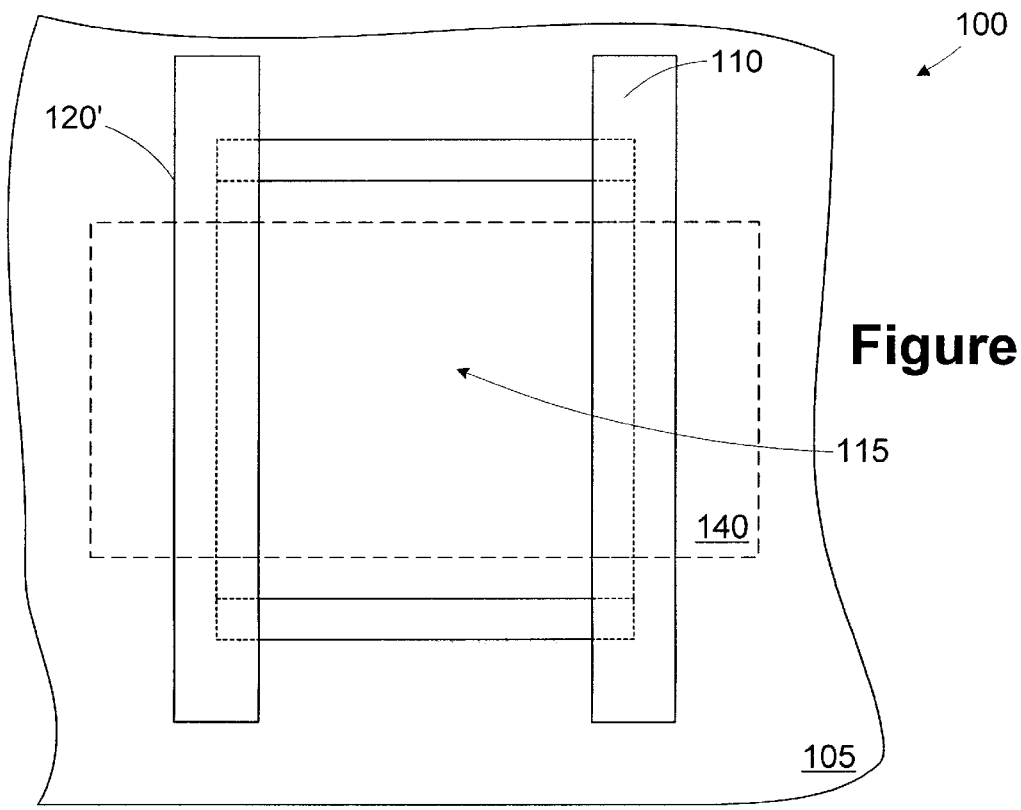
FIG. 7 is a top view of the phase-shift mask of FIG. 5 following the formation of a chromium removal layer.
Figure 8:
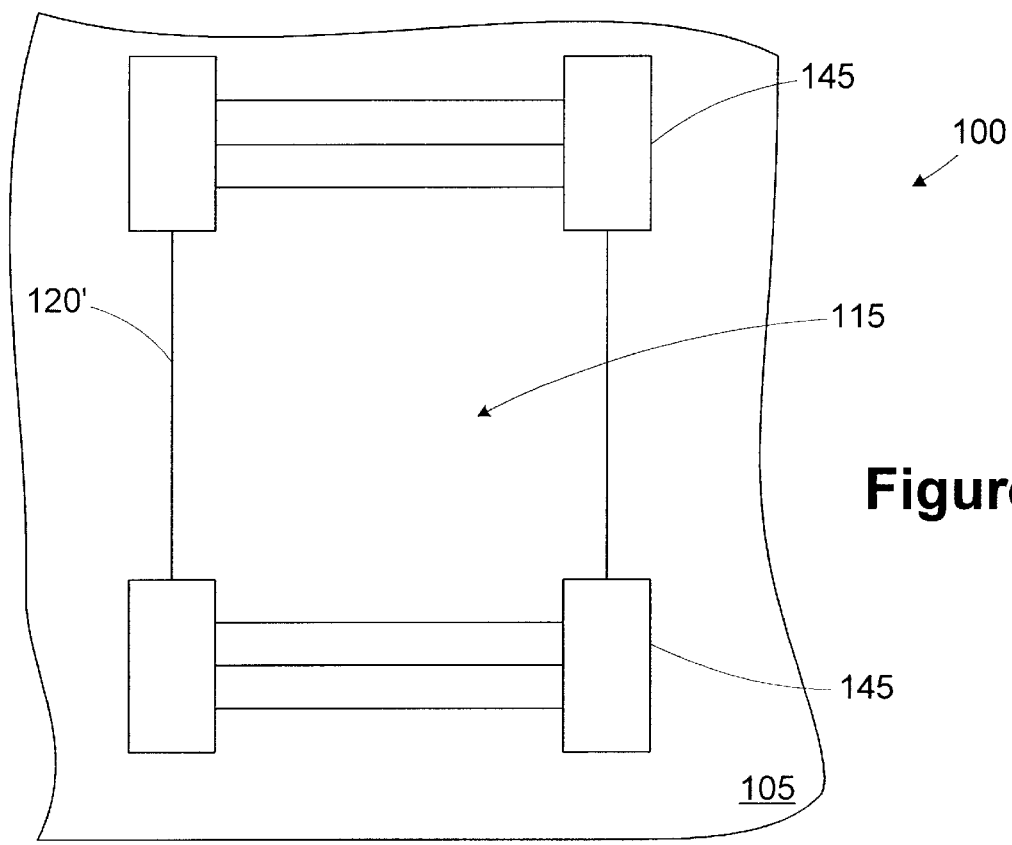
FIG. 8 is a top view of the phase-shift mask of FIG. 7 following chromium removal.

Following the undercut etch, a chrome removal layer 140 is deposited over at least a portion of the quartz substrate 105 to remove at least a portion of the chromium patterning layer 110. In one embodiment, the entire chromium patterning layer 110 is removed, resulting in a chromeless photomask 100. In another embodiment, as shown in FIGS. 7 and 8, the chrome removal layer is formed such that chromium islands 145 are left intact. The advantages of the chromium islands 145 are discussed in greater detail below in reference to FIGS. 11 and 12.

Figure 9:
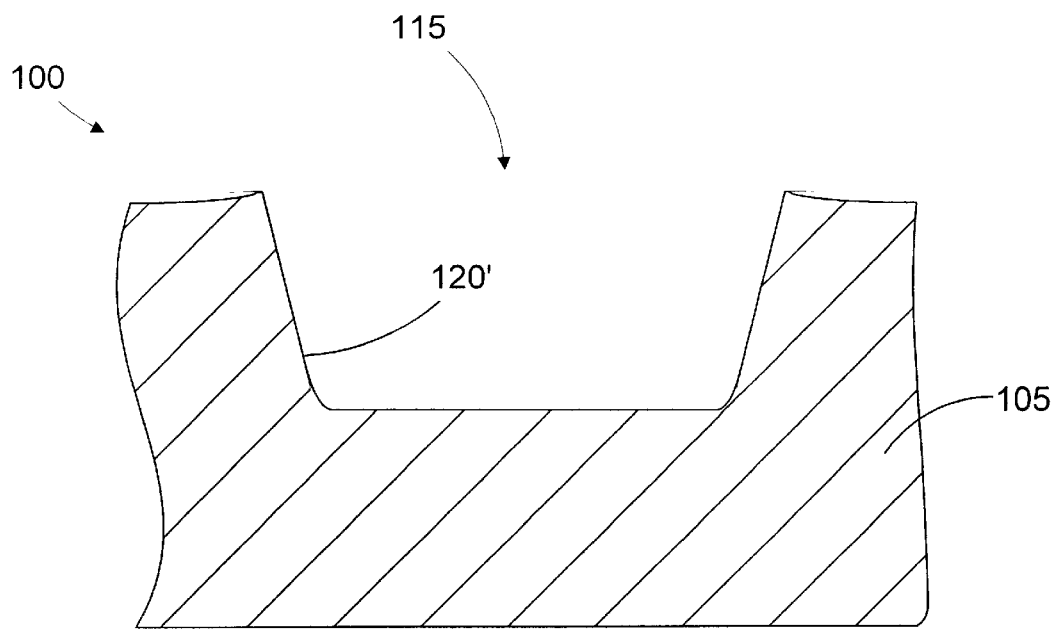
FIG. 9 is a cross-sectional view of the phase-shift mask of FIG. 8.

FIG. 9 illustrates a cross-sectional view of the completed photomask 100. The undercut etch described above, while allowing for precise control of the critical dimension, also decreases the slope of the sidewalls 120' to between about 75° and 80°. Previous phase shift masking techniques, would have rejected such a geometry, because it reduces the sharpness of the 180° phase transition, thus lightening the null and reducing the depth of focus. Conventional phase etch wisdom requires the edges 120' to be as close to vertical as possible. As stated above, the partial coherence of the incident radiation is generally ignored because it has little effect on the depth of focus due to the nearly vertical sidewalls of conventional phase shift masks.

In accordance with the present invention, the depth of focus lost due to the sloped sidewalls 120' is restored by adjusting the partial coherence of the incident radiation used in conjunction with the photomask 100 to pattern a wafer (i.e., lowering as compared to previous techniques). Theoretical determination of the optimal partial coherence is cumbersome, so an empirical technique may be employed. The completed photomask 100 is used in conjunction with a wafer stepper (not shown) to pattern a wafer. The features are measured, and the partial coherence setting on the stepper is iteratively changed until the measured features meet established design criteria, thus tuning the stepper for the particular photomask 100. In the illustrated embodiment, the partial coherence setting used with the photomask 100 is between about 0.35 and 0.48.

Figure 10:
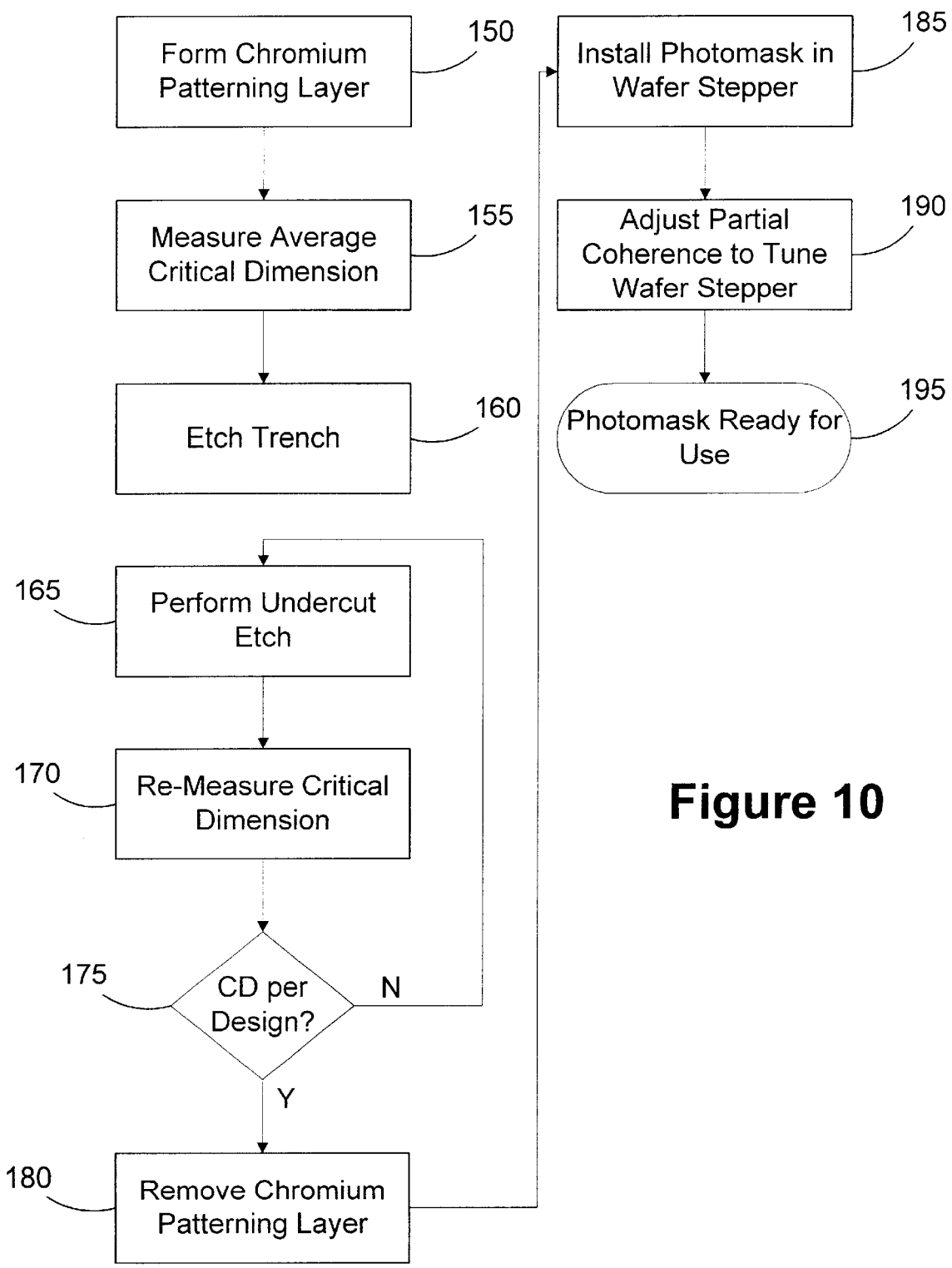
FIG. 10 is a flow diagram illustrating the a method for fabricating and preparing a photomask for use in accordance with the present invention.

The process for fabricating and preparing the photomask 100 is described in reference to FIG. 10. The chromium patterning layer 110 is formed on the quartz substrate 105 in block 150. The average critical dimension (i.e., spacing between adjacent traces) is measured in block 155. The trench 115 is etched in block 160. It is contemplated that the average critical dimension may be measured before or after the formation of the trench 115. The undercut etch is started in block 165. The photomask 100 is taken from the undercut etch solution and the trench depth is re-measured to determine the progress of the undercut etch and the resulting critical dimension in block 170. If the critical dimension corresponding to the trench depth does not meet the design criteria for the photomask 100 in block 175, the undercut etch is resumed in block 165. Otherwise, the undercut etch is terminated and the chromium patterning layer 110 is removed in block 180. The photomask 100 is installed in a wafer stepper (not shown) in block 185, and the partial coherence setting of the wafer stepper is tuned in block 190. Following tuning of the wafer stepper, the photomask 100 is ready for use in block 195.

Figure 11:
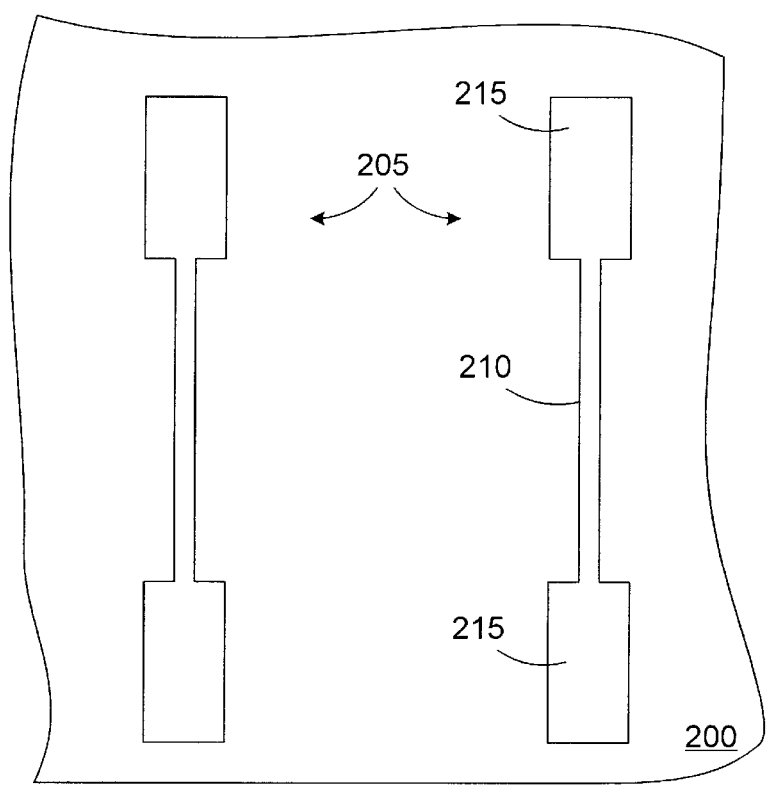
FIG. 11 is a top view of features formed on a semiconductor wafer using the phase-shift photomask of FIG. 8.

Turning now to FIG. 11, a semiconductor wafer 200 patterned with the photomask 100 is provided. The features 205 (e.g., photoresist lines, polysilicon lines, etc.) have been patterned on the semiconductor wafer 200. The features 205 include a line 210 formed corresponding to the 180° phase edge 120' and islands 215 formed corresponding to the chromium islands 145 (shown in FIG. 8) that were left intact during the chrome removal step. The line 210 is essentially homogeneous with the islands 215. Although multiple islands 215 are shown, it is contemplated that more or less islands 215 may be used. it is also contemplated that a series of contiguous phase edges 120' and islands 145 may be formed on the photomask 100 to facilitate patterning a longer line 210 with a plurality of intermediate islands 215 between segments of the line 210.

Figure 12:
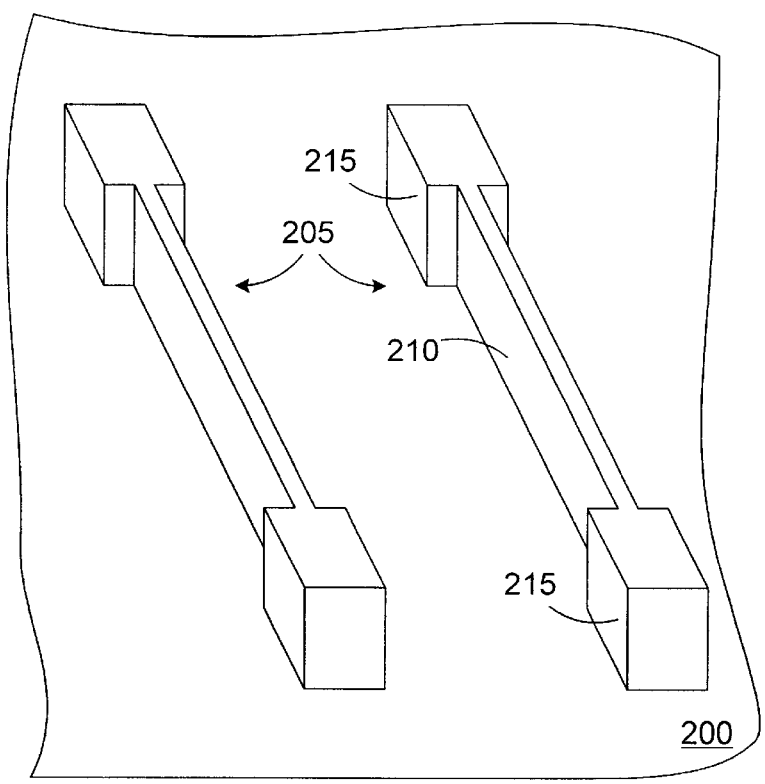
FIG. 12 is an isometric view of the features of FIG. 9.

FIG. 12 illustrates an isometric view of the features 205 formed on the semiconductor wafer 200. In the illustrated embodiment, the aspect ratio is about 5 to 1, a common aspect ratio used in semiconductor fabrication. The islands 215 provide structural support to the line 210 to help prevent the line 210 from deforming, tipping, folding, moving, etc. during subsequent processing of the semiconductor wafer 200. For example, when photoresist is developed, the semiconductor is commonly rinsed with deionized water. If the line 210 were not supported by the islands 215, there would be a potential for the line 210 to tip due to impingement from the deionized water. It is contemplated that the islands 215 may be used advantageously in other types of photomasks, such as binary masks, or non-chromeless phase-shift masks, to provide additional structural integrity to the features patterned therefrom.

The photomask 100 provides numerous advantages over previous phase-shift and non-phase-shift photomasks. The use of an undercut etch allows the critical dimension of the photomask 100 to be tightly controlled, thus allowing the patterning of dense features, such as dense transistors. The ability to tune the photomask 100 by setting the partial coherence of the light improves the flexibility and repeatability provided by the photomask 100. All of these features are useful to the application of the photomask in a production environment, where consistency controllability, and flexibility are important concerns.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a photomask, comprising:

providing a transparent substrate;

forming an opaque layer over at least a first portion of the transparent substrate;

patterning the opaque layer to define a mask pattern and expose at least a second portion of the transparent substrate;

etching the second portion to define a phase shifting region having opposing edges, the edges defining line patterning features, and the distance between the opposing edges defining a critical dimension;

measuring the critical dimension;

comparing the measured critical dimension to a predetermined design dimension;

etching the phase shifting region based on the measured critical dimension and the predetermined design dimension to undercut the opaque layer and increase the distance between the opposing edges; and removing at least a portion of the opaque layer proximate the edges.

2. The method for claim 1, further comprising re-measuring the critical dimension and continuing to etch the phase shifting region if the re-measured critical dimension does not meet the predetermined design dimension.

3. The method of claim 2, further comprising measuring the initial depth of the phase shifting region, and wherein re-measuring the critical dimension includes re-measuring the depth of the phase shifting region and comparing the re-measured depth to the initial depth to determine the critical dimension.

4. The method of claim 1, wherein the phase shifting region comprises a trench having first and second sidewalls, and measuring the critical dimension includes measuring the distance between the first and second sidewalls.

5. The method of claim 4, further comprising:

patterning at least a portion of the opaque layer to define an opaque layer removal region proximate the first and second sidewalls; and removing material of the opaque layer within the opaque layer removal region.

6. The method of claim 5, wherein the first and second sidewalls have ends, and patterning the opaque layer includes patterning the opaque layer to define at least one island adjacent at least one of the ends of at least one of the first and second sidewalls.

7. The method of claim 5, wherein the first and second sidewalls have ends, and patterning the opaque layer includes patterning the opaque layer to define an island adjacent each end of each of the first and second sidewalls.

8. The method of claim 1, wherein etching the second portion to define a phase shifting region includes etching the second portion using a reactive ion etch.

9. The method of claim 1, wherein etching the phase shifting region includes etching the phase shifting region using a wet etch.

10. The method of claim 9, wherein etching the phase shifting region includes etching the phase shifting region in a solution of sodium hydroxide.

11. A photomask, comprising:

a transparent substrate; and a phase shifting region defined in the transparent substrate, the phase shifting region including sloped sidewalls having a slope of less than about 85°, wherein each of the sloped sidewalls terminates in an edge that defines a line patterning feature, and at least a portion of the transparent substrate adjacent the edge is exposed.

12. The photomask of claim 11, wherein the slope is between about 75° and 80°.

13. The photomask of claim 11, wherein the transparent substrate comprises quartz.

14. The photomask of claim 11, wherein the sloped sidewalls have ends, and the photomask further comprises at least one island of opaque material adjacent at least one of the ends.

15. The photomask of claim 11, wherein the sloped sidewalls have ends, and the photomask further comprises a plurality of islands of opaque material adjacent the ends.

16. The photomask of claim 11, wherein the phase shifting region comprises a trench.

17. The photomask of claim 11, wherein the photomask is adapted to be used in conjunction with a radiation source emitting radiation, and the phase shifting region is sized to cause a phase shift of about 180° in the radiation incident the phase shifting region.

* * * * *